United States Patent
Liao

(10) Patent No.: US 10,497,584 B2
(45) Date of Patent: *Dec. 3, 2019

(54) METHOD AND DEVICE FOR REPAIRING SEMICONDUCTOR CHIPS

(71) Applicant: ASTI GLOBAL INC., TAIWAN, Changhua County (TW)

(72) Inventor: Chien-Shou Liao, New Taipei (TW)

(73) Assignee: ASTI GLOBAL INC., TAIWAN, Changhua County (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/036,462

(22) Filed: Jul. 16, 2018

(65) Prior Publication Data

US 2019/0181016 A1     Jun. 13, 2019

(30) Foreign Application Priority Data

Dec. 11, 2017   (TW) ............................. 106143361 A

(51) Int. Cl.
  *H01L 21/48*    (2006.01)
  *H01L 23/00*    (2006.01)
  *H01L 33/44*    (2010.01)
  *H05K 13/04*    (2006.01)

(52) U.S. Cl.
  CPC .......... *H01L 21/485* (2013.01); *H01L 24/799* (2013.01); *H01L 24/98* (2013.01); *H01L 33/44* (2013.01); *H05K 13/0486* (2013.01)

(58) Field of Classification Search
  CPC ...... H01L 21/485; H01L 24/789; H01L 33/44
  USPC .......................................................... 438/14
  See application file for complete search history.

(56) References Cited

U.S. PATENT DOCUMENTS

| | | | |
|---|---|---|---|
| 2012/0315710 A1* | 12/2012 | Hozawa | H01L 21/6835 438/5 |
| 2016/0001575 A1* | 1/2016 | Kim | B41J 2/45 324/414 |
| 2018/0003365 A1* | 1/2018 | Nanni | F21V 17/14 |
| 2018/0277589 A1* | 9/2018 | Chang | H01L 27/15 |
| 2018/0309019 A1* | 10/2018 | Liao | H01L 33/0095 |

* cited by examiner

*Primary Examiner* — Igwe U Anya
(74) *Attorney, Agent, or Firm* — Li & Cai Intellectual Property (USA) Office

(57) ABSTRACT

The present invention provides a method and a device for repairing semiconductor chips. The method includes providing an LED module including a circuit substrate and a plurality of light-emitting units; driving the light-emitting units by a signal generator; measuring at least one light-emitting unit by a feature detector module so as to obtain an abnormal feature and define the at least one light-emitting unit as a bad light-emitting unit having the abnormal feature; projecting a laser light source generated by a laser generating module onto the bad light-emitting unit; removing the bad light-emitting unit from the circuit substrate by a chip pick-and-place module to form a vacancy; placing a good light-emitting unit inside the vacancy by the chip pick-and-place module; and electrically connecting the good light-emitting unit to the circuit substrate. Therefore, the bad light-emitting unit is replaced by the good light-emitting unit for repairing the LED module.

10 Claims, 5 Drawing Sheets

METHOD AND DEVICE FOR REPAIRING SEMICONDUCTOR CHIPS

FIELD OF THE INVENTION

The present disclosure relates to a method and a device for repairing chips, and more particularly to a method and a device for repairing semiconductor chips.

BACKGROUND OF THE INVENTION

In recent years, LEDs (light-emitting diodes) have been used widely due to good light-emitting quality and high light-emitting efficiency. LEDs have been developed capable of emitting red, green, and blue light, and LEDs have been increasingly used for various applications such as a full-color LED display, so that color performance of the full-color LED display can be increased. Typically, the red, green, and blue lights respectively generated by the red, green, and blue LEDs mixed to form colored light with high brightness and contrast, so as to display some information for viewer.

SUMMARY OF THE INVENTION

One aspect of the present disclosure relates to a method and a device for repairing semiconductor chips.

One of the embodiments of the present disclosure provides a method for repairing semiconductor chips, including: providing an LED module that includes a circuit substrate and a light-emitting group disposed on the circuit substrate and electrically connected to the circuit substrate, wherein the light-emitting group includes a plurality of light-emitting units, each light-emitting unit includes an LED chip and a conductive substance disposed between a bottom side of the LED chip and the circuit substrate; providing the LED module with a predetermined signal generated by a signal generator so as to drive the light-emitting units; measuring at least one of the light-emitting units by a feature detector module so as to obtain an abnormal feature and define the at least one light-emitting unit as a bad light-emitting unit having the abnormal feature; projecting a laser light source generated by a laser generating module onto the bad light-emitting unit so as to decrease the bonding strength between the bad light-emitting unit and the circuit substrate; removing the bad light-emitting unit from the circuit substrate by a chip pick-and-place module so as to form a vacancy on the light-emitting group; placing a good light-emitting unit inside the vacancy of the light-emitting group by the chip pick-and-place module, wherein the good light-emitting unit includes a good LED chip and a new conductive substance disposed on a bottom side of the good LED chip; and then projecting the laser light source generated by the laser generating module onto the good light-emitting unit so as to fix the good light-emitting unit on the circuit substrate and electrically connect the good light-emitting unit to the circuit substrate.

Another one of the embodiments of the present disclosure provides a method for repairing semiconductor chips, including: providing an LED module that includes a circuit substrate and a plurality of light-emitting units disposed on the circuit substrate and electrically connected to the circuit substrate, wherein at least one of the light-emitting units is a bad light-emitting unit; providing the LED module with a predetermined signal generated by a signal generator so as to drive the light-emitting units; measuring at least one of the light-emitting units by a feature detector module so as to obtain an abnormal feature and define the at least one light-emitting unit as a bad light-emitting unit having the abnormal feature; projecting a laser light source generated by a laser generating module onto the bad light-emitting unit so as to decrease the bonding strength between the bad light-emitting unit and the circuit substrate; removing the bad light-emitting unit from the circuit substrate by a chip pick-and-place module so as to form a vacancy; placing a good light-emitting unit inside the vacancy by the chip pick-and-place module; and then electrically connecting the good light-emitting unit to the circuit substrate.

Yet another one of the embodiments of the present disclosure provides a device for repairing semiconductor chips, and the device can be applied to an LED module. The LED module includes a circuit substrate and a plurality of light-emitting units disposed on the circuit substrate and electrically connected to the circuit substrate. The device for repairing semiconductor chips includes a signal generator, a feature detector module, a laser generating module and a chip pick-and-place module. The signal generator is electrically connected to the circuit substrate for providing the LED module with a predetermined signal so as to drive the light-emitting units. The feature detector module is adjacent to the circuit substrate for measuring at least one of the light-emitting units so as to obtain an abnormal feature and define the at least one light-emitting unit as a bad light-emitting unit having the abnormal feature. The laser generating module is adjacent to the circuit substrate and disposed under the circuit substrate for generating a laser light source. The chip pick-and-place module is adjacent to the light-emitting unit and disposed above the light-emitting unit. The laser light source generated by the laser generating module is projected onto the bad light-emitting unit so as to decrease the bonding strength between the bad light-emitting unit and the circuit substrate. The bad light-emitting unit is removed from the circuit substrate by the chip pick-and-place module so as to form a vacancy, and a good light-emitting unit is placed inside the vacancy by the chip pick-and-place module.

Therefore, by matching the features of "providing the LED module with a predetermined signal generated by a signal generator so as to drive the light-emitting units; and measuring at least one of the light-emitting units by a feature detector module so as to obtain an abnormal feature and define the at least one light-emitting unit as a bad light-emitting unit having the abnormal feature;" or "a signal generator for providing the LED module with a predetermined signal so as to drive the light-emitting units; and a feature detector module for measuring at least one of the light-emitting units so as to obtain an abnormal feature and define the at least one light-emitting unit as a bad light-emitting unit having the abnormal feature", the bad light-emitting unit can be found by the method and the device for repairing semiconductor chips.

Therefore, by matching the features of "projecting a laser light source generated by a laser generating module onto the bad light-emitting unit so as to decrease the bonding strength between the bad light-emitting unit and the circuit substrate", "removing the bad light-emitting unit from the circuit substrate by a chip pick-and-place module so as to form a vacancy", "placing a good light-emitting unit inside the vacancy by the chip pick-and-place module" and "electrically connecting the good light-emitting unit to the circuit substrate", the bad light-emitting unit can be replaced by the good light-emitting unit so as to repair the LED module.

Therefore, by matching the features of "the laser generating module adjacent to the circuit substrate and disposed under the circuit substrate for generating a laser light source" and "the chip pick-and-place module adjacent to the light-emitting unit and disposed above the light-emitting unit", the laser light source generated by the laser generating module can be projected onto the bad light-emitting unit so as to decrease the bonding strength between the bad light-emitting unit and the circuit substrate, and the bad light-emitting unit can be removed from the circuit substrate by the chip pick-and-place module so as to form a vacancy. Whereby, a good light-emitting unit can be placed inside the vacancy by the chip pick-and-place module, so that the bad light-emitting unit can be replaced by the good light-emitting unit so as to repair the LED module.

To further understand the techniques, means and effects of the present disclosure, the following detailed descriptions and appended drawings are hereby referred to, such that, and through which, the purposes, features and aspects of the present disclosure can be thoroughly and concretely appreciated. However, the appended drawings are provided solely for reference and illustration, without any intention to limit the present disclosure.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure.

DETAILED DESCRIPTION OF THE PREFERRED EMBODIMENTS

Embodiments of a method and a device for repairing semiconductor chips according to the present disclosure are described herein. Other advantages and objectives of the present disclosure can be easily understood by one skilled in the art from the disclosure. The present disclosure can be applied in different embodiments. Various modifications and variations can be made to various details in the description for different applications without departing from the scope of the present disclosure. The drawings of the present disclosure are provided only for simple illustrations, but are not drawn to scale and do not reflect the actual relative dimensions. The following embodiments are provided to describe in detail the concept of the present disclosure, and are not intended to limit the scope thereof in any way.

It should be understood that the definite articles like "the first," "the second" or "the third" may be used to describe various components or signals, but these components or signals should not be limited to definite articles. These definite articles are used for distinguish one component from the other component or one signal from the other signal. Besides, the phrase "or" shown in the present disclosure should be interpreted as anyone item listed in the correlated items or the combination of multiple items listed in the correlated items according to the actual conditions.

Figure 1:
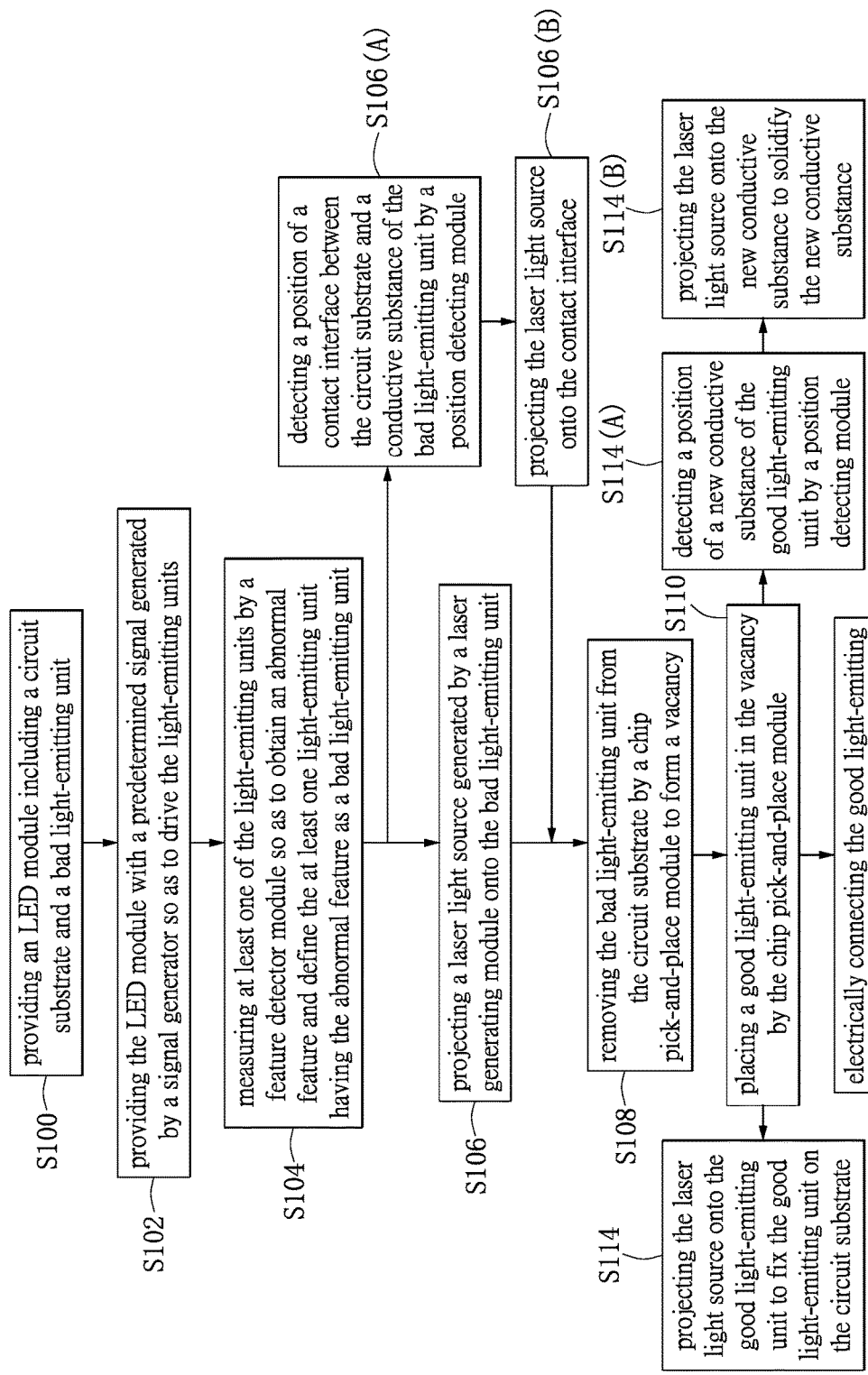
FIG. 1 shows a flowchart of a method for repairing semiconductor chips according to the present disclosure.
Figure 2:
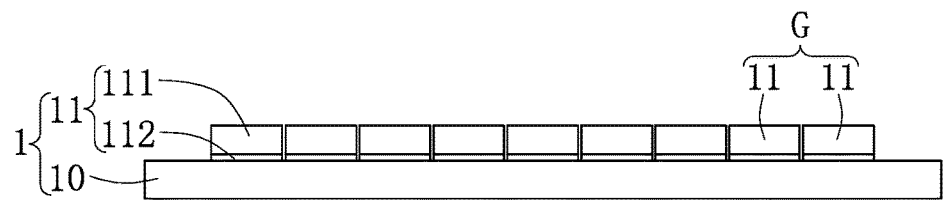
FIG. 2 shows a schematic view of step S100 of the method for repairing semiconductor chips according to the present disclosure.

Referring to FIG. 1 to FIG. 7, the present disclosure provides a method for repairing semiconductor chips, including the following steps:

Firstly, referring to FIG. 1 and FIG. 2, providing an LED module 1 that includes a circuit substrate 10 and a plurality of light-emitting units 11 disposed on the circuit substrate 10 and electrically connected to the circuit substrate 10 (step S100). In other words, the LED module 1 includes a circuit substrate 10 and a light-emitting group G disposed on the circuit substrate 10 and electrically connected to the circuit substrate 10, and the light-emitting group G includes a plurality of light-emitting units 11.

For example, each light-emitting unit 11 includes an LED chip 111 and a conductive substance 112 disposed between a bottom side of the LED chip 111 and the circuit substrate 10. In addition, the LED chip 111 may be a GaN LED chip or any type of LED chip. The conductive substance 112 may be an anisotropic conductive film (ACF), an anisotropic conductive paste (ACP) or any type of conductive material. It should be noted that the bad light-emitting unit 11B may have an LED chip 111 that is unable to provide a light source, or the bad light-emitting unit 11B may have a conductive substance 112 that is unable to provide a conductive path. However, it is merely an example and is not meant to limit the scope of the present disclosure.

Figure 3:
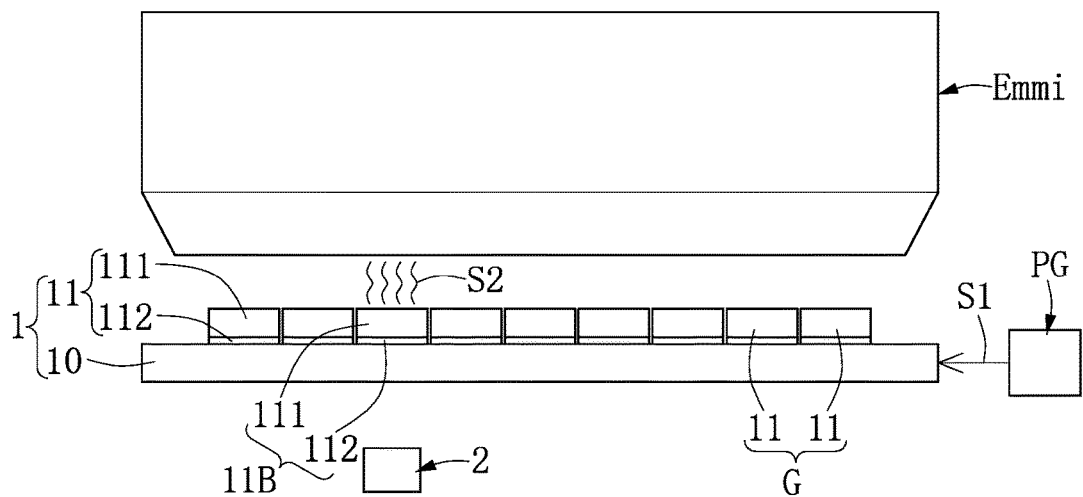
FIG. 3 shows a schematic view of steps S102 and S104 of the method for repairing semiconductor chips according to the present disclosure.

Next, referring to FIG. 1 and FIG. 3, providing the LED module 1 with a predetermined signal S1 generated by a signal generator PG so as to drive the light-emitting units 1 (step S102); then measuring at least one of the light-emitting units 11 by a feature detector module (Emmi) so as to obtain an abnormal feature S2 and define the at least one light-emitting unit 11 as a bad light-emitting unit 11B having the abnormal feature (step S104). For example, the LED chip 111 of each light-emitting unit 11 receives the predetermined signal S1 so as to generate a predetermined heat source or a predetermined light source. In addition, the signal generator PG can be a pattern generator and the predetermined signal S1 provided by the signal generator PG can be a back current or a forward current. Furthermore, the abnormal feature S2 measured by the feature detector module (Emmi) can be an abnormal feature of heat liberation or an abnormal feature of light intensity, but the present disclosure is not limited thereto.

Figure 4:
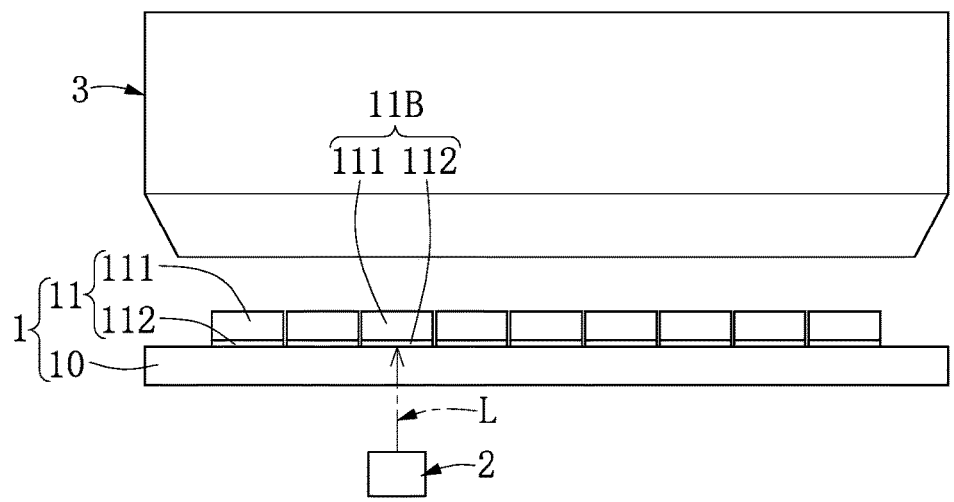
FIG. 4 shows a schematic view of steps S106 and S106(B) of the method for repairing semiconductor chips according to the present disclosure.

Afterward, referring to FIG. 1 and FIG. 4, projecting a laser light source L generated by a laser generating module 2 onto the bad light-emitting unit 11B so as to decrease the bonding strength or the adhesive strength between the bad light-emitting unit 11B and the circuit substrate 10 (step S106). For example, when the laser light source L generated by the laser generating module 2 is projected onto the bad light-emitting unit 11B, the bonding strength or the adhesive strength between the bad light-emitting unit 11B and the circuit substrate 10 would be decreased, so that it is easy for the bad light-emitting unit 11B to separate from the circuit substrate 10.

Figure 5:
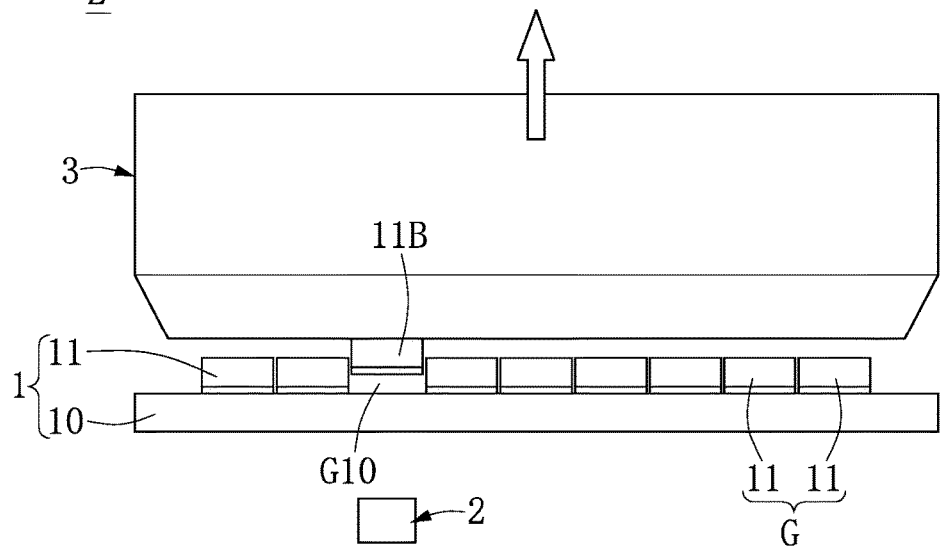
FIG. 5 shows a schematic view of step S108 of the method for repairing semiconductor chips according to the present disclosure.

Subsequently, referring to FIG. 1 and FIG. 5, removing the bad light-emitting unit 11B from the circuit substrate 10 by a chip pick-and-place module 3 so as to form a vacancy G10 (step S108), or removing the bad light-emitting unit 11B from the circuit substrate 10 by a chip pick-and-place module 3 so as to form a vacancy G10 on the light-emitting group G. For example, chip pick-and-place module 3 may be a vacuum sucker, a vacuum suction nozzle, or any type of pick and place machine, but it is not meant to limit the scope of the present disclosure.

Figure 6:
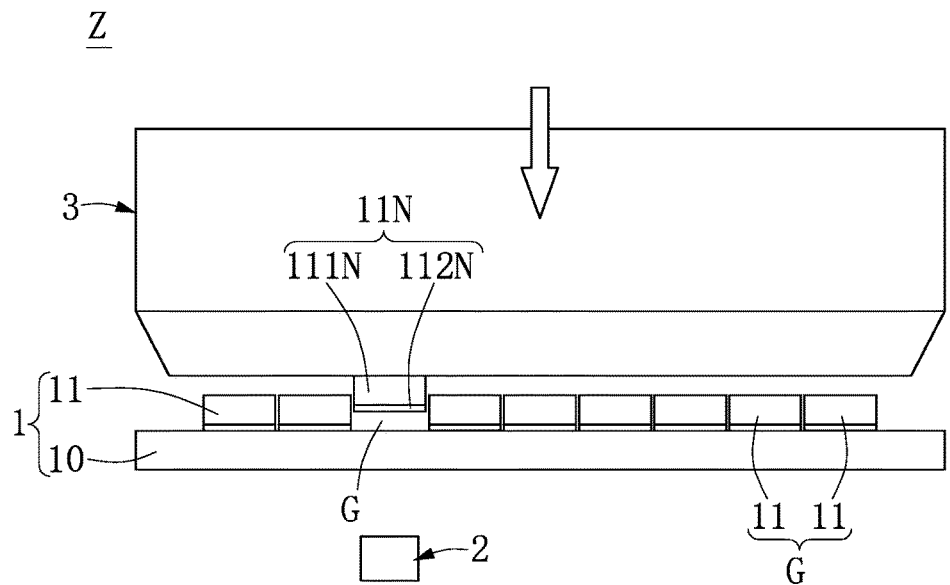
FIG. 6 shows a schematic view of step S110 of the method for repairing semiconductor chips according to the present disclosure.

Thereafter, referring to FIG. 1 and FIG. 6, placing a good light-emitting unit 11N inside the vacancy G10 by the chip pick-and-place module 3 (step S110), or placing a good light-emitting unit 11N inside the vacancy G10 of the light-emitting group G by the chip pick-and-place module 3. For example, the good light-emitting unit 11N includes a good LED chip 111N and a new conductive substance 112N disposed on a bottom side of the good LED chip 111N, and the new conductive substance 112N may be an anisotropic conductive paste or any type of conductive material, but it is not meant to limit the scope of the present disclosure.

Figure 7:
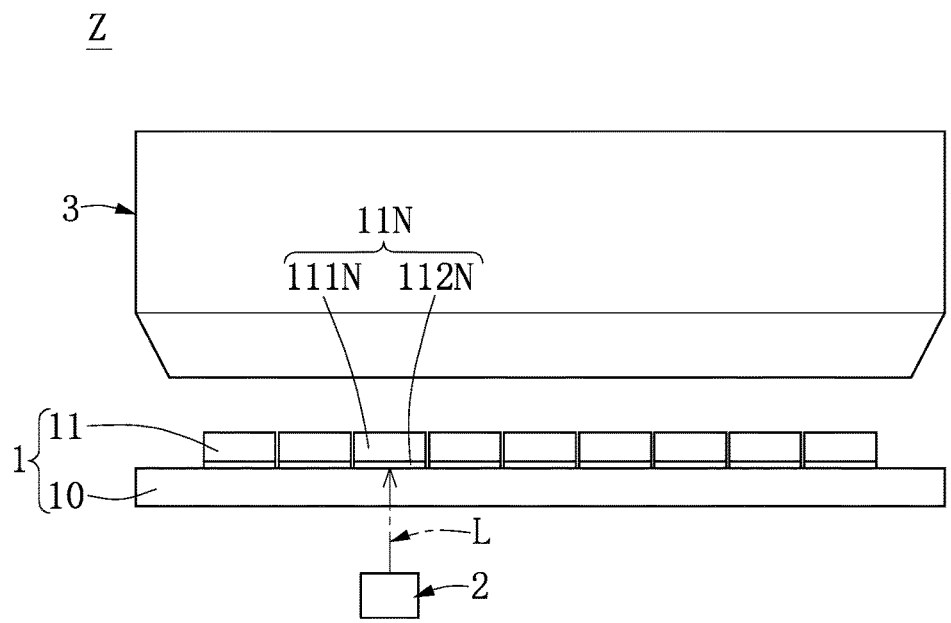
FIG. 7 shows a schematic view of steps S112, S114, and S114(B) of the method for repairing semiconductor chips according to the present disclosure.

Afterward, referring to FIG. 1 and FIG. 7, electrically connecting the good light-emitting unit 11N to the circuit substrate 10 (step S112). For example, the step (S112) of electrically connecting the good light-emitting unit 11N to the circuit substrate 10 further includes: projecting the laser light source L generated by the laser generating module 2 onto the good light-emitting unit 11N so as to fix the good light-emitting unit 11N on the circuit substrate 10 and electrically connect the good light-emitting unit 11N to the circuit substrate 10 (step S114).

Figure 8:
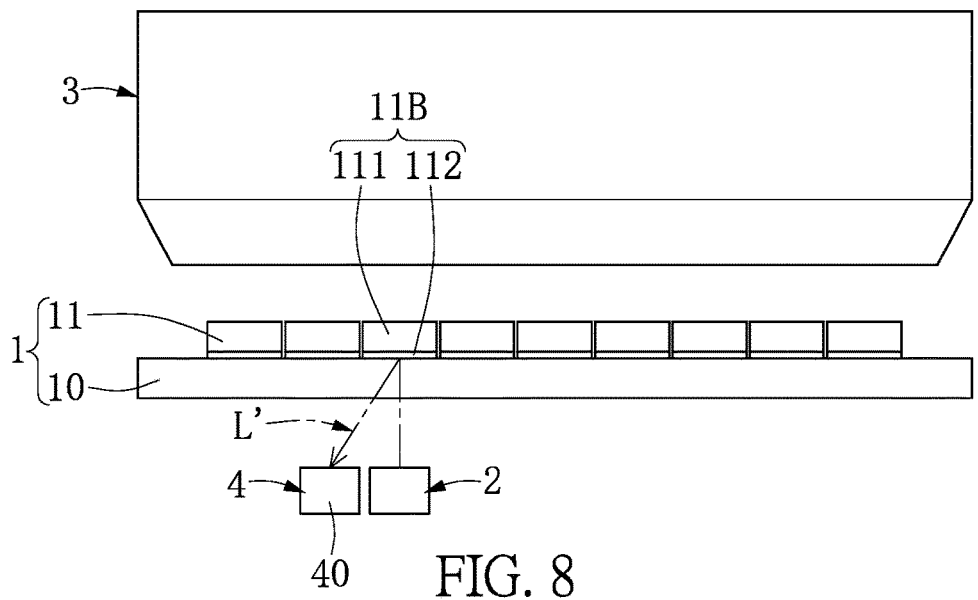
FIG. 8 shows a schematic view of step S106(A) of the method for repairing semiconductor chips according to the present disclosure.

More particularly, referring to FIG. 1, FIG. 4 and FIG. 8, the step (S106) of projecting the laser light source L generated by the laser generating module 2 onto the bad light-emitting unit 11B further includes: referring to FIG. 1 and FIG. 8, detecting a position of a contact interface between the circuit substrate 10 and the conductive substance 112 of the bad light-emitting unit 11B by a position detecting module 4 (step S106(A)); and then referring to FIG. 1 and FIG. 4, projecting the laser light source L generated by the laser generating module 2 onto the contact interface between the circuit substrate 10 and the conductive substance 112 of the bad light-emitting unit 11B so as to decrease the bonding strength between the circuit substrate 10 and the conductive substance 112 of the bad light-emitting unit 11B (step S106(B)). For example, as shown in FIG. 8, the position detecting module 4 at least includes a receiving element 40 for receiving a detection wave L' (such as a detection signal) that can be provided by the laser generating module 2, but it is not meant to limit the scope of the present disclosure.

Figure 9:
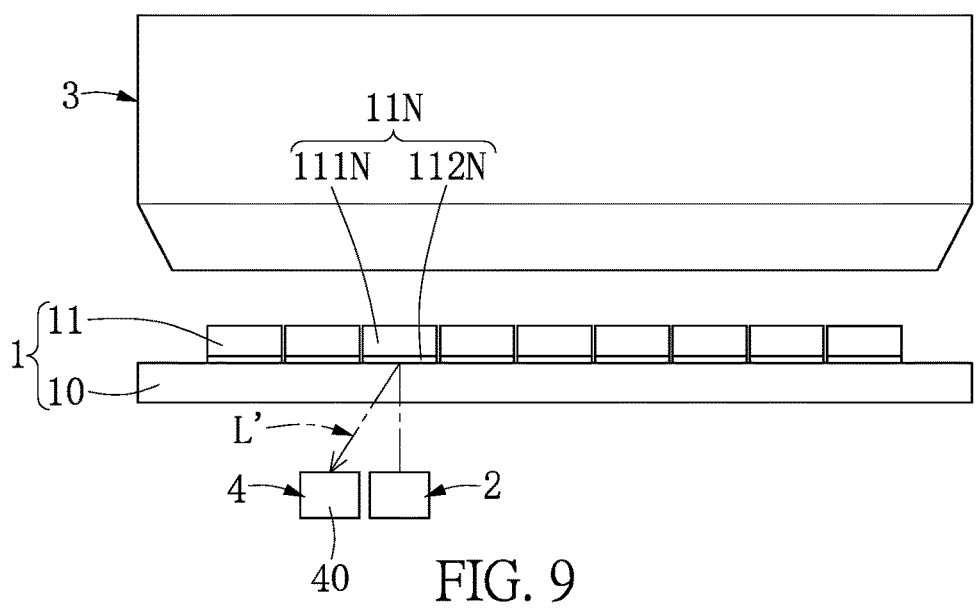
FIG. 9 shows a schematic view of step S114(A) of the method for repairing semiconductor chips according to the present disclosure.

More particularly, referring to FIG. 1, FIG. 7 and FIG. 9, the step (S114) of projecting the laser light source L generated by the laser generating module 2 onto the good light-emitting unit 11N further includes: referring to FIG. 1 and FIG. 9, detecting a position of the new conductive substance 112N of the good light-emitting unit 11N by a position detecting module 4 (step S114(A)), and then referring to FIG. 1 and FIG. 7, projecting the laser light source L generated by the laser generating module 2 onto the new conductive substance 112N of the good light-emitting unit 11N so as to solidify the new conductive substance 112N (step S114(B)). For example, as shown in FIG. 9, the position detecting module 4 at least includes a receiving element 40 for receiving a detection wave L' (such as a detection signal) that can be provided by the laser generating module 2, but it is not meant to limit the scope of the present disclosure.

It should be noted that referring to FIG. 1 to FIG. 9, the present disclosure further provides a device Z for repairing semiconductor chips, including a signal generator PG, a feature detector module (Emmi), a laser generating module 2 and a chip pick-and-place module 3. For example, the device Z for repairing semiconductor chips can be applied to an LED module 1. The LED module 1 includes a circuit substrate 10 and a plurality of light-emitting units 11 disposed on the circuit substrate 10 and electrically connected to the circuit substrate 10.

More particularly, the signal generator PG is electrically connected to the circuit substrate 10 for providing the LED module 1 with a predetermined signal S1 so as to drive the light-emitting units 11. In addition, the feature detector module (Emmi) is adjacent to the circuit substrate 10 for measuring at least one of the light-emitting units 11 so as to obtain an abnormal feature S2 and define the at least one light-emitting unit 11 having the abnormal feature as a bad light-emitting unit 11B. For example, the LED chip 111 of each light-emitting unit 11 receives the predetermined signal S1 so as to generate a predetermined heat source or a predetermined light source. Furthermore, the signal generator PG can be a pattern generator and the predetermined signal S1 provided by the signal generator PG can be a back current or a forward current. Moreover, the abnormal feature S2 measured by the feature detector module (Emmi) can be an abnormal feature of heat liberation or an abnormal feature of light intensity, but the present disclosure is not limited thereto.

More particularly, referring to FIG. 4 and FIG. 7, the laser generating module 2 is adjacent to the circuit substrate 10 and disposed under the circuit substrate 10 for generating a laser light source L.

For example, as shown in FIG. 4, the laser light source L generated by the laser generating module 2 can be projected onto the bad light-emitting unit 11B so as to decrease the bonding strength between the bad light-emitting unit 11B and the circuit substrate 10. That is to say, the laser light source L generated by the laser generating module 2 can be projected onto the contact interface between the circuit substrate 10 and the conductive substance 112 of the bad light-emitting unit 11B so as to decrease the bonding strength between the circuit substrate 10 and the conductive substance 112 of the bad light-emitting unit 11B.

For example, as shown in FIG. 7, the laser light source L generated by the laser generating module 2 can be projected onto the good light-emitting unit 11N so as to fix the good light-emitting unit 11N on the circuit substrate 10 and electrically connect the good light-emitting unit 11N to the circuit substrate 10. That is to say, the laser light source L generated by the laser generating module 2 can be projected onto the new conductive substance 112N of the good light-emitting unit 11N so as to solidify the new conductive substance 112N, so that the good light-emitting unit 11N can be fixed on the circuit substrate 10 and electrically connected to the circuit substrate 10.

More particularly, referring to FIG. 6 and FIG. 7, the chip pick-and-place module 3 is adjacent to the light-emitting unit 11 and disposed above the light-emitting unit 11. For example, the bad light-emitting unit 11B can be removed from the circuit substrate 10 by the chip pick-and-place module 3 so as to form a vacancy G10 (as shown in FIG. 6), and a good light-emitting unit 11N can be placed inside the vacancy G10 by the chip pick-and-place module 3 (as shown in FIG. 7).

More particularly, referring to FIG. 8 and FIG. 9, the device Z for repairing semiconductor chips further includes a position detecting module 4 adjacent to the circuit substrate 10 and disposed under the circuit substrate 10 for detecting a position of a contact interface between the circuit substrate 10 and a conductive substance 112 of the bad light-emitting unit 11B, or for detecting a position of a new conductive substance 112N of the good light-emitting unit 11N.

Therefore, by matching the features of "providing the LED module 1 with a predetermined signal S1 generated by a signal generator PG so as to drive the light-emitting units 11; and measuring at least one of the light-emitting units 11 by a feature detector module (Emmi) so as to obtain an abnormal feature S2 and define the at least one light-emitting unit 11 as a bad light-emitting unit 11B having the abnormal feature;" or "a signal generator PG for providing the LED module 1 with a predetermined signal S1 so as to drive the light-emitting units 11; and a feature detector module (Emmi) for measuring at least one of the light-emitting units 11 so as to obtain an abnormal feature S2 and define the at least one light-emitting unit 11 having the abnormal feature S2 as a bad light-emitting unit 11B", the bad light-emitting unit 11B can be found by the method and the device Z for repairing semiconductor chips.

Therefore, by matching the features of "projecting a laser light source L generated by a laser generating module 2 onto the bad light-emitting unit 11B so as to decrease the bonding strength between the bad light-emitting unit 11B and the circuit substrate 10", "removing the bad light-emitting unit 11B from the circuit substrate 10 by a chip pick-and-place module 3 so as to form a vacancy G10", "placing a good light-emitting unit 11N inside the vacancy G10 by the chip pick-and-place module 3" and "electrically connecting the good light-emitting unit 11N to the circuit substrate 10", the bad light-emitting unit 11B can be replaced by the good light-emitting unit 11N so as to repair the LED module 1.

Therefore, by matching the features of "the laser generating module 2 adjacent to the circuit substrate 10 and disposed under the circuit substrate 10 for generating a laser light source L" and "the chip pick-and-place module 3 adjacent to the light-emitting unit 11 and disposed above the light-emitting unit 11", the laser light source L generated by the laser generating module 2 can be projected onto the bad light-emitting unit 11B so as to decrease the bonding strength between the bad light-emitting unit 11B and the circuit substrate 10, and the bad light-emitting unit 11B can be removed from the circuit substrate 10 by the chip pick-and-place module 3 so as to form a vacancy G10. Whereby, a good light-emitting unit 11N can be placed inside the vacancy G10 by the chip pick-and-place module 3, so that the bad light-emitting unit 11B can be replaced by the good light-emitting unit 11N so as to repair the LED module 1.

The aforementioned descriptions merely represent the preferred embodiments of the present disclosure, without any intention to limit the scope of the present disclosure which is fully described only within the following claims. Various equivalent changes, alterations or modifications based on the claims of the present disclosure are all, consequently, viewed as being embraced by the scope of the present disclosure.

What is claimed is:

1. A method for repairing semiconductor chips, comprising:
   providing an LED module that includes a circuit substrate and a light-emitting group disposed on the circuit substrate and electrically connected to the circuit substrate, wherein the light-emitting group includes a plurality of light-emitting units, each light-emitting unit includes an LED chip and a conductive substance disposed between a bottom side of the LED chip and the circuit substrate;
   providing the LED module with a predetermined signal generated by a signal generator so as to drive the light-emitting units;
   measuring at least one of the light-emitting units by a feature detector module so as to obtain an abnormal feature and define the at least one light-emitting unit as a bad light-emitting unit having the abnormal feature;
   projecting a laser light source generated by a laser generating module onto the bad light-emitting unit so as to decrease the bonding strength between the bad light-emitting unit and the circuit substrate;
   removing the bad light-emitting unit from the circuit substrate by a chip pick-and-place module so as to form a vacancy on the light-emitting group;
   placing a good light-emitting unit inside the vacancy of the light-emitting group by the chip pick-and-place module, wherein the good light-emitting unit includes a good LED chip and a new conductive substance disposed on a bottom side of the good LED chip; and
   projecting the laser light source generated by the laser generating module onto the good light-emitting unit so as to fix the good light-emitting unit on the circuit substrate and electrically connect the good light-emitting unit to the circuit substrate.

2. The method of claim 1, wherein the step of projecting the laser light source generated by the laser generating module onto the bad light-emitting unit further comprises:
   detecting a position of a contact interface between the circuit substrate and the conductive substance of the bad light-emitting unit by a position detecting module; and
   projecting the laser light source generated by the laser generating module onto the contact interface between the circuit substrate and the conductive substance of the bad light-emitting unit so as to decrease the bonding strength between the circuit substrate and the conductive substance of the bad light-emitting unit;
   wherein the position detecting module includes a receiving element for receiving a detection wave;
   wherein the LED chip is a GaN LED chip, the conductive substance is an anisotropic conductive film, and the new conductive substance is an anisotropic conductive paste;
   wherein the LED chip of each light-emitting unit receives the predetermined signal so as to generate a predetermined heat source or a predetermined light source, the predetermined signal provided by the signal generator is a back current, and the abnormal feature measured by the feature detector module is an abnormal feature of heat liberation.

3. The method of claim 1, wherein the step of projecting the laser light source generated by the laser generating module onto the good light-emitting unit further comprises:
   detecting a position of the new conductive substance of the good light-emitting unit by a position detecting module; and projecting the laser light source generated by the laser generating module onto the new conductive substance of the good light-emitting unit so as to solidify the new conductive substance;

wherein the position detecting module includes a receiving element for receiving a detection wave;

wherein the LED chip is a GaN LED chip, the conductive substance is an anisotropic conductive film, and the new conductive substance is an anisotropic conductive paste;

wherein the LED chip of each light-emitting unit receives the predetermined signal so as to generate a predetermined heat source or a predetermined light source, the predetermined signal provided by the signal generator is a back current, and the abnormal feature measured by the feature detector module is an abnormal feature of heat liberation.

4. A method for repairing semiconductor chips, comprising:

providing an LED module that includes a circuit substrate and a plurality of light-emitting units disposed on the circuit substrate and electrically connected to the circuit substrate, wherein at least one of the light-emitting units is a bad light-emitting unit;

providing the LED module with a predetermined signal generated by a signal generator so as to drive the light-emitting units;

measuring at least one of the light-emitting units by a feature detector module so as to obtain an abnormal feature and define the at least one light-emitting unit as a bad light-emitting unit having the abnormal feature;

projecting a laser light source generated by a laser generating module onto the bad light-emitting unit so as to decrease the bonding strength between the bad light-emitting unit and the circuit substrate;

removing the bad light-emitting unit from the circuit substrate by a chip pick-and-place module so as to form a vacancy;

placing a good light-emitting unit inside the vacancy by the chip pick-and-place module; and electrically connecting the good light-emitting unit to the circuit substrate.

5. The method of claim 4, wherein the step of projecting the laser light source generated by the laser generating module onto the bad light-emitting unit further comprises:

detecting a position of a contact interface between the circuit substrate and a conductive substance of the bad light-emitting unit by a position detecting module; and projecting the laser light source generated by the laser generating module onto the contact interface between the circuit substrate and the conductive substance of the bad light-emitting unit so as to decrease the bonding strength between the circuit substrate and the conductive substance of the bad light-emitting unit;

wherein the position detecting module includes a receiving element for receiving a detection wave;

wherein the LED chip is a GaN LED chip, the conductive substance is an anisotropic conductive film, and the new conductive substance is an anisotropic conductive paste;

wherein the LED chip of each light-emitting unit receives the predetermined signal so as to generate a predetermined heat source or a predetermined light source, the predetermined signal provided by the signal generator is a back current, and the abnormal feature measured by the feature detector module is an abnormal feature of heat liberation.

6. The method of claim 4, wherein the step of electrically connecting the good light-emitting unit to the circuit substrate further comprises: projecting the laser light source generated by the laser generating module onto the good light-emitting unit so as to fix the good light-emitting unit on the circuit substrate and electrically connect the good light-emitting unit to the circuit substrate.

7. The method of claim 6, wherein the step of projecting the laser light source generated by the laser generating module onto the good light-emitting unit further comprises:

detecting a position of the new conductive substance of the good light-emitting unit by a position detecting module; and projecting the laser light source generated by the laser generating module onto the new conductive substance of the good light-emitting unit so as to solidify the new conductive substance;

wherein the position detecting module includes a receiving element for receiving a detection wave;

wherein the LED chip is a GaN LED chip, the conductive substance is an anisotropic conductive film, and the new conductive substance is an anisotropic conductive paste;

wherein the LED chip of each light-emitting unit receives the predetermined signal so as to generate a predetermined heat source or a predetermined light source, the predetermined signal provided by the signal generator is a back current, and the abnormal feature measured by the feature detector module is an abnormal feature of heat liberation.

8. A device for repairing semiconductor chips, the device being applied to an LED module, the LED module including a circuit substrate and a plurality of light-emitting units disposed on the circuit substrate and electrically connected to the circuit substrate, the device comprising:

a signal generator electrically connected to the circuit substrate for providing the LED module with a predetermined signal so as to drive the light-emitting units;

a feature detector module adjacent to the circuit substrate for measuring at least one of the light-emitting units so as to obtain an abnormal feature and define the at least one light-emitting unit as a bad light-emitting unit having the abnormal feature;

a laser generating module adjacent to the circuit substrate and disposed under the circuit substrate for generating a laser light source; and a chip pick-and-place module adjacent to the light-emitting unit and disposed above the light-emitting unit;

wherein the laser light source generated by the laser generating module is projected onto the bad light-emitting unit so as to decrease the bonding strength between the bad light-emitting unit and the circuit substrate;

wherein the bad light-emitting unit is removed from the circuit substrate by the chip pick-and-place module so as to form a vacancy, and a good light-emitting unit is placed inside the vacancy by the chip pick-and-place module.

9. The device of claim 8, further comprising: a position detecting module adjacent to the circuit substrate and disposed under the circuit substrate for detecting a position of a contact interface between the circuit substrate and a conductive substance of the bad light-emitting unit, wherein the laser light source generated by the laser generating module is projected onto the contact interface between the circuit substrate and the conductive substance of the bad light-emitting unit so as to decrease the bonding strength between the circuit substrate and the conductive substance of the bad light-emitting unit, wherein the position detecting module includes a receiving element for receiving a detection wave, and wherein the LED chip is a GaN LED chip, the conductive substance is an anisotropic conductive film, and the new conductive substance is an anisotropic conductive paste; and wherein the LED chip of each light-emitting unit receives the predetermined signal so as to generate a predetermined heat source or a predetermined light source, the predetermined signal provided by the signal generator is a back current, and the abnormal feature measured by the feature detector module is an abnormal feature of heat liberation.

10. The device of claim 8, further comprising: a position detecting module adjacent to the circuit substrate and disposed under the circuit substrate for detecting a position of a new conductive substance of the good light-emitting unit, wherein the laser light source generated by the laser generating module is projected onto the good light-emitting unit so as to fix the good light-emitting unit on the circuit substrate and electrically connect the good light-emitting unit to the circuit substrate, and the laser light source generated by the laser generating module is projected onto the new conductive substance of the good light-emitting unit so as to solidify the new conductive substance, wherein the position detecting module includes a receiving element for receiving a detection wave, and wherein the LED chip is a GaN LED chip, the conductive substance is an anisotropic conductive film, and the new conductive substance is an anisotropic conductive paste; and wherein the LED chip of each light-emitting unit receives the predetermined signal so as to generate a predetermined heat source or a predetermined light source, the predetermined signal provided by the signal generator is a back current, and the abnormal feature measured by the feature detector module is an abnormal feature of heat liberation.

\* \* \* \* \*